(12) United States Patent
Kim

(10) Patent No.: US 7,635,640 B2
(45) Date of Patent: Dec. 22, 2009

(54) METHOD OF FABRICATING POLYCRYSTALLINE SILICON THIN FILM FOR IMPROVING CRYSTALLIZATION CHARACTERISTICS AND METHOD OF FABRICATING LIQUID CRYSTAL DISPLAY DEVICE USING THE SAME

(75) Inventor: Sang Hyun Kim, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 651 days.

(21) Appl. No.: 11/406,282

(22) Filed: Apr. 19, 2006

(65) Prior Publication Data

US 2006/0189052 A1 Aug. 24, 2006

Related U.S. Application Data

(62) Division of application No. 10/661,486, filed on Sep. 15, 2003, now Pat. No. 7,153,762.

(30) Foreign Application Priority Data

Jun. 30, 2003 (KR) ...................... 10-2003-0044002

(51) Int. Cl.
H01L 21/00 (2006.01)
(52) U.S. Cl. ........................ 438/486; 438/166; 438/798
(58) Field of Classification Search ................. 438/486, 438/166, 798
See application file for complete search history.

(56) References Cited

U.S. PATENT DOCUMENTS 6,326,268 B1 * 12/2001 Park et al. ................... 438/262
6,368,945 B1 * 4/2002 Im ............................. 438/487
6,475,872 B1 * 11/2002 Jung ........................... 438/384
6,563,077 B2 * 5/2003 Im .......................... 219/121.65
6,573,163 B2 * 6/2003 Voutsas et al. .............. 438/487
6,746,942 B2 * 6/2004 Sakamoto et al. ........... 438/586
6,852,626 B1 * 2/2005 Wada et al. ................. 438/681
6,949,422 B2 * 9/2005 Kim ............................ 438/166
6,979,632 B1 * 12/2005 Ohtani et al. ................ 438/487
7,153,762 B2 * 12/2006 Kim ............................ 438/486
7,557,050 B2 * 7/2009 Chung et al. ................ 438/798
2004/0248345 A1 * 12/2004 Chang ......................... 438/166
2005/0170569 A1 * 8/2005 Yazaki et al. ................ 438/155
2005/0277236 A1 * 12/2005 Shimomura et al. ......... 438/166
2006/0063351 A1 * 3/2006 Jain ............................ 438/455
2006/0228908 A1 * 10/2006 Chung et al. ................ 438/795
2007/0254490 A1 * 11/2007 Jain ............................ 438/736

FOREIGN PATENT DOCUMENTS

WO WO 03/052833 A1 * 6/2003

* cited by examiner

Primary Examiner—Laura M Menz
(74) Attorney, Agent, or Firm—McKenna Long & Aldridge LLP

(57) ABSTRACT

A crystallization method of an amorphous semiconductor layer includes providing an amorphous semiconductor layer having a first thickness, crystallizing the amorphous semiconductor layer in a first direction, partially reducing the crystallized semiconductor layer to a second thickness less than the first thickness and crystallizing the etched semiconductor layer in a second direction.

11 Claims, 8 Drawing Sheets

METHOD OF FABRICATING POLYCRYSTALLINE SILICON THIN FILM FOR IMPROVING CRYSTALLIZATION CHARACTERISTICS AND METHOD OF FABRICATING LIQUID CRYSTAL DISPLAY DEVICE USING THE SAME

This application is a Divisional Application of U.S. patent application Ser. No. 10/661,486, filed on Sep. 15, 2003 now U.S. Pat. No.7,153,762, now allowed, which claims priority to Korean Application No. 2003-44002, filed Jun. 30, 2003, all of which are hereby incorporated by reference as if fully set forth herein.

The present invention claims the benefit of Korean Patent Application No. 200344002 filed in Korea on Jun. 30, 2003, which is hereby incorporated by reference.

BACKGROUND OF THE INVENTION

1. Field of the Invention

The present invention relates to a method of fabricating a polycrystalline silicon thin film, and more particularly, to a method of fabricating a polycrystalline silicon thin film for improving crystallization characteristics and a method of fabricating a liquid crystal display device using the same.

2. Description of the Related Art

Recently, because of the need for an information display and a high demand for using a portable information systems, light and thin film type flat panel display (FPD) devices have been actively being researched and commercialized such that the conventional device of a cathode ray tube (CRT) is being replaced. Among these flat panel display devices, a liquid crystal display (LCD) device is used for displaying an image by using an optical anisotropy of a liquid crystal. A liquid crystal display can be used in notebook computer, a desktop monitor, and other display devices due to its excellent resolution, color rendering capability and picture quality.

An active matrix (AM), a typical driving method used in the liquid crystal display device, drives the pixels of a pixel region in a liquid crystal display by using an amorphous silicon thin film transistor (a-Si TFT) as a switching device in each of the pixels. The amorphous silicon thin film transistor technique was described by English LeComber et al. in 1979, and commercialized as a 3-inch liquid crystal portable television in 1986. Recently, a thin film transistor liquid crystal display having a display area of more than 50 inches has been developed. However, the field effect mobility of the amorphous silicon thin film transistor of about 1 cm$^2$/Vsec prevents its use in peripheral circuits that apply signals to the pixel region, since peripheral circuits operate at more than 1 MHz. Accordingly, research for simultaneously forming a switching transistor in a pixel region and peripheral circuits in a driving circuit region together on a glass substrate by using polycrystalline silicon (poly-Si) thin film transistor having a field effect mobility greater than that of the amorphous silicon thin film transistor has been actively pursued.

The polycrystalline silicon thin film transistor has been applied to a small flat panel displays, such as the eyepiece of a camcorder, since a liquid crystal color television was developed in 1982. Such a thin film transistor has a low photosensitivity and a high field effect mobility as well as can be directly fabricated on a substrate to form driving circuits. Increased mobility can increase an operation frequency of the driving circuits. The frequency capability of the driving circuits determines the number of pixels that can be driven while maintaining an adequate display capability. More specifically, the increased frequency decrease the charging time of a signal applied to a pixel such that distortion of the signal is decreased and picture quality is increased. Compared to the amorphous silicon thin film transistor, which has a high driving voltage of about 25V, the polycrystalline silicon thin film transistor, which has a driving voltage of under 10V, consumes less power.

The polycrystalline silicon thin film transistor can be fabricated by being directly deposited or by depositing an amorphous silicon thin film that is then crystallized with a thermal process. To use a cheap glass substrate, a method for performing low temperature processing and increasing a field effect mobility of a thin film transistor is required. The thermal processing methods for crystallizing the amorphous silicon thin film basically include the solid phase crystallization (SPC) method and the excimer laser annealing (ELA) method.

The solid phase crystallization method forms a polycrystalline silicon thin film at a low temperature of approximately 600° C. In this method, a polycrystalline silicon thin film is formed by depositing an amorphous silicon thin film on a glass substrate having a low melting point and then performing a slow heating process for up to tens of hours at approximately 600° C. A polycrystalline silicon thin film obtained by the solid phase crystallization method has grains of a comparatively large size corresponding to several μm (micrometers). However, there are many defects in the grains. Although not as bad as grain boundaries in a polycrystalline thin film transistor, these defects are a bad influence on a performance of a polycrystalline silicon thin film transistor.

The excimer laser annealing is a typical method of fabricating a polycrystalline silicon thin film transistor at a low temperature. The excimer laser crystallizes an amorphous silicon thin film by radiating a high energy laser beam onto the amorphous silicon thin film for a time of tens of nanoseconds. In this method, the amorphous silicon is melted and crystallized in a very short moment, so that the glass substrate is not damaged at all. A polycrystalline silicon thin film fabricated using the excimer laser also has excellent electric characteristics compared to a polycrystalline silicon thin-film fabricated by a general thermal processing method. For example, whereas a field effect mobility of an amorphous silicon thin film transistor is 0.1~0.2 cm$^2$/Vsec and a field effect mobility of a polycrystalline silicon thin film transistor fabricated by a general thermal processing method is 10~20 cm$^2$/Vsec, and a field effect mobility of a polycrystalline silicon thin film transistor fabricated using the excimer laser method is more than 100 cm$^2$/Vsec (IEEE Trans. Electron Devices, vol. 36, no. 12, p. 2868, 1989).

Hereinafter, a crystallization method using the excimer laser will be explained in more detail. FIG. 1 is a graph showing a grain size of a polycrystalline silicon thin film corresponding to irradiated laser energy density used to form the polycrystalline silicon thin film. As shown in FIG. 1, in the first region A and in the second region B, the more the laser energy density is increased, the grain size of a polycrystalline silicon thin film is increased as discussed in IEEE Electron Device Letters, DEL-7, 276, 1986. However, in the third region C, if energy more than a specific energy density Ec is irradiated, the grain size of a crystallized polycrystalline silicon thin film drastically decreases. That is, according to an irradiated laser energy density graph shown in FIG. 1, the silicon crystallization mechanism of a silicon thin film becomes different past a specific energy density Ec.

FIGS. 2A to 2C are sectional views showing a silicon crystallization mechanism corresponding to the laser energy density graph of FIG. 1. A crystallization mechanism of an amorphous silicon during laser annealing is influenced by many factors, such as laser irradiation conditions including laser energy density, an irradiation pressure, a substrate temperature, and physical/geometrical characteristics including absorption coefficient, thermal conductivity, mass, impurity containing degree and amorphous silicon layer thickness. Amorphous silicon has a very high absorption coefficient near the wavelength of an excimer laser, thereby absorbing energy within a range of 30~200 ns at the time the amorphous silicon is being irradiated and melted.

In FIG. 2A, the first region A of FIG. 1 is a partial melting region, and an amorphous silicon thin film 12 is crystallized only up to the dotted line and a size of a grain G1 formed at this time corresponds to hundreds of Å. If a laser beam is irradiated on the amorphous silicon thin film 12 on a substrate 10 where a buffer layer 11 is formed, the amorphous silicon thin film 12 is melted. As a strong laser energy is irradiated directly onto a surface of the amorphous silicon thin film 12, a weaker laser energy is irradiated on a lower portion of the amorphous silicon thin film 12 such that crystallization is performed down to a certain part of the amorphous silicon thin film 12. Typically, crystal growth by laser crystallization is performed through a process of melting a surface layer of an amorphous silicon in accordance with the laser irradiation followed by latent heat generation in a lower layer corresponding to a solidification of the surface layer and a melting of a lower layer followed by a solidification of the lower layer. These crystal growth processes will be explained in more detail as follows.

An amorphous silicon thin film on which a laser is irradiated has a melting temperature of more than 1200° C. and primarily melts into a liquid state. Then, since the surface melted layer has a greater temperature difference from a lower silicon and a substrate, the surface melted layer cools fast with a quenching speed of more than $10^9$ K/s until a solid phase nucleation and a solidification are achieved. The surface layer is melted until the solid phase nucleation and the solidification are achieved. The melting-state lasts for a long time when the laser energy density is high or a thermal emission to the outside is low. Since the surface layer is melted at a lower temperature than a melting temperature of 1400° C. for crystalline silicon, the surface layer is cooled and maintained as a super-cooled state where a temperature is lower than a phase transition. The greater the super-cooling state is, that is, the lower a melting temperature of a thin film or the faster a cooling speed is, the larger the nucleation rate is at the time of solidification such that fine crystal growth results.

When solidification starts as the melted surface layer is cooled, crystal growth proceeds in an upward direction from a crystal nucleus. At this time, latent heat according to a phase transition of the melted surface layer from a liquid state to a solid state is generated and thus secondarily melts a lower amorphous silicon thin film. Then, a solidification of the lower amorphous silicon thin film occurs resulting in crystal growth. At this time, a nucleus generation rate of the lower second melted layer is increased because the lower amorphous silicon thin film is in more of a super cooled state than the first melted layer. Thus, the crystal size resulting from the second melted layer is smaller. To improve crystalline characteristics resulting from crystallization by a laser annealing, the cooling speed of solidification has to be reduced. Cooling speed can be reduced by restraining absorbed laser energy from being emitted out by heating the substrate, double beam irradiation, and/or by a buffer insulating layer between the substrate and the amorphous silicon layer.

FIG. 2B is a sectional view showing a silicon crystallization mechanism of the second region B of FIG. 1, in which the second region B represents a near-completely crystallized region. In FIG. 2B, a polycrystalline silicon thin film having grains G2 of a large size: corresponding to 3000~4000 Å is formed up from an interface of the lower buffer layer 11 and the amorphous silicon thin film 12. That is, according to an energy density corresponding to said region, the amorphous silicon thin film 12 is melted down to a region near the buffer layer 11, so that dense grains on the interface between the amorphous silicon thin film 12 and the buffer layer 11 serve as a nucleus N such that solidification occurs in all directions when crystallization occurs. Accordingly, large grained polycrystalline silicon is formed, as discussed in the Journal of Applied Physics 82, 4086. However, a distribution density of the crystal nucleus N is not uniform. Further, the size of the grains are not uniform. Also, a protuberance portion P is formed on the top surface of the grains G2 that lowers the physical characteristics of the polycrystalline silicon thin film.

FIG. 2C is a sectional view showing a silicon crystallization mechanism of the third region C of FIG. 1 corresponding to a completely crystallized region. In FIG. 2C, grains G3 having a very small size are irregularly formed with the energy density corresponding to said region. That is, when a laser energy density becomes more than a certain level Ec, the amorphous silicon thin film 12 of an irradiated region is all melted and a nucleus which can grow as grains does not exist. Thus, when the amorphous silicon thin film 12 irradiated by a laser of strong energy is drastically cooled, a large number of crystal nucleuses N are generated and minute grains G3 are formed from said crystal nucleuses.

Different from a single crystal, a polycrystalline silicon thin film formed by said crystallization mechanism has a grain boundary. The grain boundary results from a thermal stress generated as melted amorphous silicon is solidified. Grain boundaries lowers a device's electrical characteristics. In order to obtain a high mobility, the density of grain boundaries has to be low, which can be achieved by increasing the grain size of a crystallized polycrystalline silicon thin film. However, in a crystallized polycrystalline silicon thin film in a liquid crystal display, the uniformity of grain size and the morphology of grains are more important than a grain size.

In the case of grains in an active layer constituting a thin film transistor in a liquid crystal display device, if the grain size is not uniform, each thin film transistor will have a different field effect mobility. Thus, there will be a non-uniformity of picture quality across an entire display panel. Also, if a channel of a thin film transistor is not formed in parallel with a longitudinal direction of grains (that is, a direction in which the number of times to meet with a grain boundary is less), a high mobility can not be obtained even if a grain size is large. This is because the grain boundary acts as an obstacle blocking movement of a carrier so as to decrease mobility. This direction-dependent characteristic of grains causes problems, especially in a thin film transistor of a driving circuit region.

SUMMARY OF THE INVENTION

Accordingly, the present invention is directed to a method of fabricating a polycrystalline silicon thin film for improving crystallization characteristics and a method of fabricating a liquid crystal display device using the same that substantially obviate one or more of the problems due to limitations and disadvantages of the related art.

An object of the present invention is to provide an improved crystallization method of an amorphous semiconductor layer resulting in a uniform grain size with no direction-dependent grain characteristic.

Another object of the present invention is to provide a method of fabricating a polycrystalline thin film transistor having increased electrical characteristics.

Still another object of the present invention is to enable a system on panel (SOP) by applying said polycrystalline thin film transistor having an improved crystallization characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a crystallization method of an amorphous semiconductor layer includes the steps of providing an amorphous semiconductor layer having a first thickness, crystallizing the amorphous semiconductor layer in a first direction, partially reducing the crystallized semiconductor layer to a second thickness less than the first thickness and crystallizing the etched semiconductor layer in a second direction.

In another aspect, a fabrication method of a polycrystalline thin film transistor includes providing a substrate, forming an amorphous semiconductor layer over the substrate, crystallizing the amorphous semiconductor layer in a first direction, reducing the crystallized semiconductor layer, and crystallizing in a second direction to form a polycrystalline semiconductor layer, forming a gate insulating layer on the polycrystalline semiconductor layer, forming a gate electrode on the gate insulating layer, forming an insulating layer on the substrate and forming a source electrode and a drain electrode contacting the polycrystalline semiconductor layer.

In another aspect, a method of fabricating a thin film transistor includes the steps of providing a substrate, forming an amorphous semiconductor layer on the substrate, crystallizing the amorphous semiconductor layer into a polycrystalline semiconductor layer having grains with a quasi-rectangular shape, forming a gate insulating layer on the substrate, forming a gate electrode on the gate insulating layer, forming an insulating layer on the polycrystalline semiconductor layer and forming a source electrode and a drain electrode contacting the polycrystalline semiconductor layer.

In another aspect, a method of fabricating a liquid crystal display device includes: forming a first thin film transistor in a driving circuit region by using a crystallized semiconductor layer as an active layer by providing a first substrate composed of a pixel region and a driving circuit region, forming an amorphous semiconductor layer on the first substrate, laterally crystallizing the amorphous semiconductor layer in a first direction, reducing the crystallized semiconductor layer, and laterally crystallizing the crystallized semiconductor layer in a second direction perpendicular to the first direction; forming a second thin film transistor in the pixel region; forming a pixel electrode electrically connected to the second thin film transistor on the first substrate; providing a second substrate where a color filter layer is formed; attaching the first substrate and the second substrate to each other; and forming a liquid crystal layer between the first substrate and the second substrate. It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Figure 1:
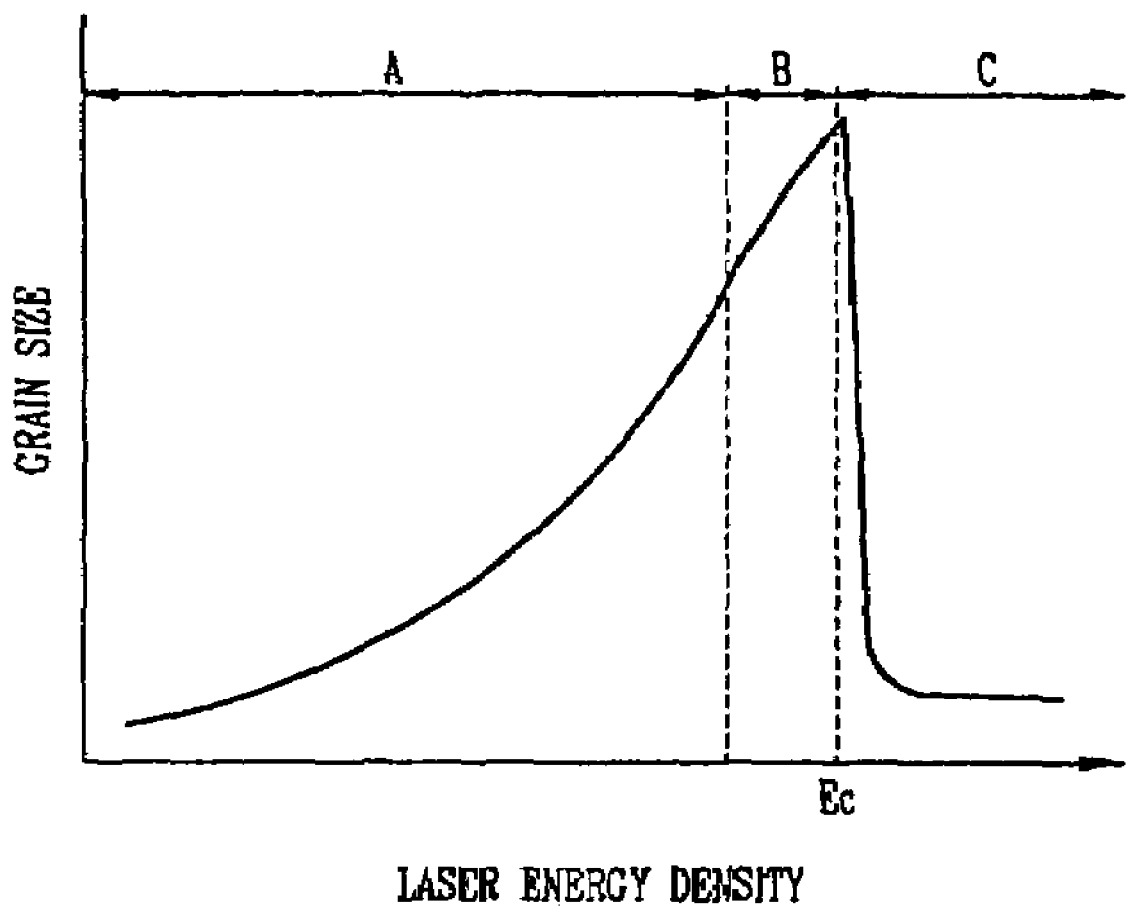
FIG. 1 is a graph showing a grain size of a polycrystalline silicon thin film corresponding to irradiated laser energy density used to form the polycrystalline silicon thin film.
Figure 2A:
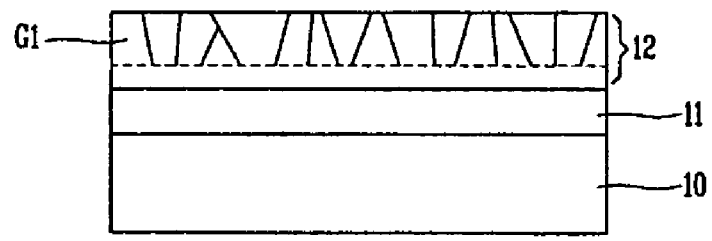
FIGS. 2A to 2C are sectional views showing a silicon crystallization mechanism corresponding to the laser energy density graph of FIG. 1.
Figure 2B:
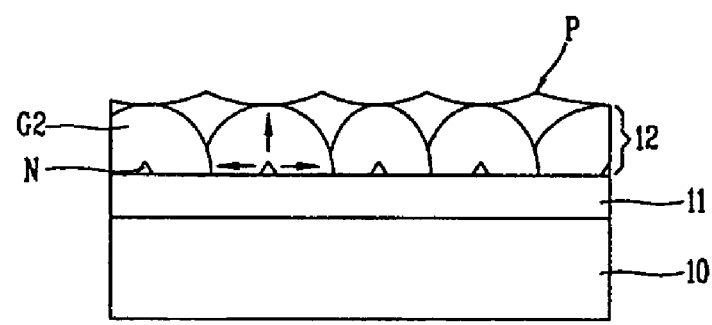
Figure 2C:
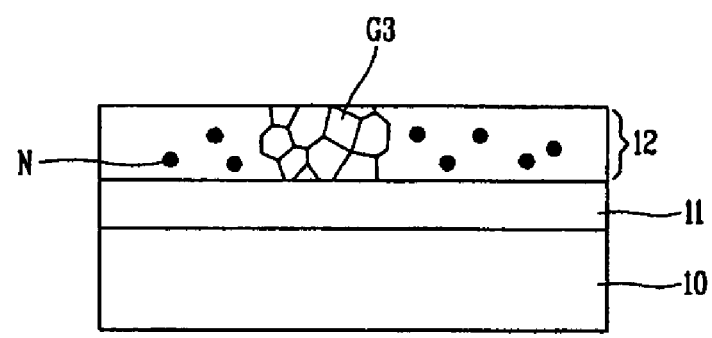

Reference will now be made in detail to the preferred embodiments of the present invention, examples of which are illustrated in the accompanying drawings.

The present invention provides a fabrication method of a polycrystalline silicon thin film having no direction-dependent characteristic of grains by improving a crystallization method. Generally, pixels in a pixel region and peripheral circuits in a driving circuit region contain thin film transistors. Since a thin film transistor in a pixel only has to satisfy mobility corresponding to approximately 20~50 $cm^2/Vs$, high electrical performance characteristic is not required. On the other hand, in the driving circuit region, an N-channel thin film transistor and a P-channel thin film transistor have to all be formed with a high electrical performance characteristics. The electrical characteristic of mobility for the thin film transistors in the driving circuit region greatly influences the driving of a liquid crystal display device. Typically, a mobility corresponding to hundreds of $cm^2/Vs$ is required.

Typically, the channel of a polycrystalline silicon thin film transistor is formed in parallel with the longitudinal direction of grains such that the number of grain boundaries in the channel is reduced. This is because grain boundaries act as an obstacle to the movement of carriers such that mobility of the device is decreased. Since all of the thin film transistors of the driving circuit region are not arranged in the same direction, channels of the thin film transistors can have a great variation in terms of mobility. Due to the arbitrary direction characteristic of channels in thin film transistors of the driving circuit region, it is important to remove a direction-dependent characteristic of grains in the polycrystalline silicon thin film for the channels. Even if each of the grains are formed as a large single crystal, the morphology of the grains has to have a uniform characteristic in any arbitrary direction. According to embodiments of the present invention, a polycrystalline silicon thin film having a quasi-single crystal is formed by a first lateral crystallization in a first direction and a second lateral crystallization in a second direction crossing the first direction to obtain a polycrystalline thin film having an approximately rectangular shape such that the characteristic of direction dependence is removed.

Typically, an amorphous silicon thin film used in the crystallization in accordance with embodiments of the invention has a thickness corresponding to about 500 Å due to productivity of a deposition equipment and to achieve a desired electrical characteristic. In the case that an active layer is thick, leakage current is increased and the on-off ratio is decreased. However, to attenuate defect of numerous grain boundaries, the time duration of a melted state of amorphous silicon has to be increased. To increase the time duration, an amorphous silicon thin film used in crystallization is formed thickly.

Accordingly, in an embodiment of the present invention, the thickness of an amorphous silicon is formed to be thicker than that of a general active layer at the time of a first lateral crystallization to obtain a polycrystalline silicon thin film having a small number of grain boundaries. Then, the crystallized silicon is reduced so as to leave a final active thickness. Subsequently, a second lateral crystallization process is performed to obtain large single crystal grains of a quasi-rectangular shape. Hereinafter, preferred embodiments of a fabrication method of a polycrystalline silicon thin film according to the present invention will be explained in more detail.

FIGS. 3A to 3D are flow charts showing a crystallization method according to a first embodiment of the present invention, which shows a lateral crystallization method. In said embodiment, a sequential lateral solidification (SLS) technique was used as the lateral crystallization method. However, another lateral crystallization methods, such as a selectively enlarging laser crystallization (SELAX) or a metal induced lateral crystallization (MILC), can be used. The sequential lateral solidification is a technique based upon the fact that a silicon grains grow in a vertical direction at an interface between a liquid silicon and a solid silicon as described in Robert S. Sposilli, M. A. Crowder, and James S. Im, Material Research Society Symposium Process Vol. 452, 956~957, 1997. According to the sequential lateral solidification technique, silicon grains are laterally grown with a certain length by properly controlling a laser energy density and a laser irradiation scope to thereby crystallize amorphous silicon thin film into a quasi-single crystal.

Figure 3A:
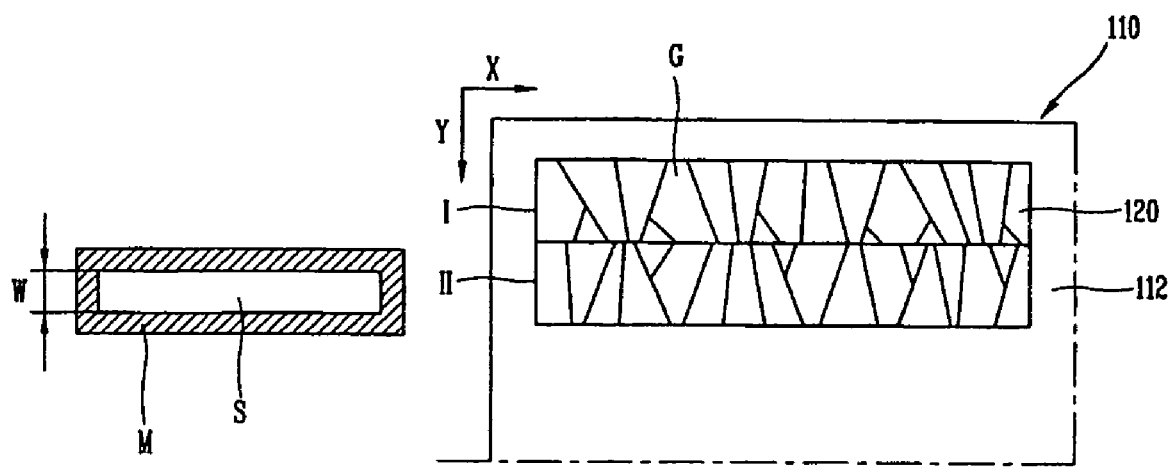
FIGS. 3A to 3D are flow charts showing a fabrication method of a polycrystalline silicon thin film according to a first embodiment of the present invention.

First, as shown in FIG. 3A, a first laser is irradiated on an amorphous silicon thin film 112 that is deposited to a certain thickness using a mask M including a slit S having a certain width W. At this time, regions 1 and 11 are irradiated by a laser through the slit S such that regions 1 and 11 come in to contact with each other as the grains laterally grow around the silicon thin film 112. The mask M, except the slit S formed at the center, shields the amorphous silicon thin film 112 from the irradiating laser beam. The material of the mask M, a chrome based metal or an aluminum based metal has an excellent shielding effect and reflection rate.

In said embodiment, the mask M having one slit S was used to crystallize, but any mask M of any shape can be used if a desired crystallization characteristic can be obtained. Also, in said embodiment, in order to be used as an active layer, the amorphous silicon thin film 112 was deposited with 500 Å thickness corresponding to a general thickness and used in crystallization. Hereinafter, crystal growth processes according to the sequential lateral solidification of the preferred embodiment will be explained in more detail.

First, if a laser having an energy density where the amorphous silicon thin film 112 is completely melted (the third region C of FIG. 1) or a laser having more energy density is irradiated, the amorphous silicon thin film 112 is completely melted. Just after the laser energy irradiation, the amorphous silicon thin film 112 is cooled through upper and lower amorphous silicon surfaces, that is, regions on which the laser was not irradiated. This is because the amorphous silicon thin film 112 of the upper and lower surfaces are in a solid state, which has a greater thermal conductivity than a buffer layer of a lower portion of the amorphous silicon thin film 112 or a glass substrate 110.

Accordingly, the amorphous silicon thin film 112 in a liquid state cools to a nucleus forming temperature at the upper and lower interfaces between a solid state and a liquid state earlier than at a center portion to form a crystal nucleus. After the crystal nucleus is formed, a lateral growth of the grains G proceeds from the sides where temperatures are low to where the temperature is high. In said method, by irradiating a laser on the amorphous silicon thin film 112 with the nearly same width as a distance (~1 μm) at which a lateral growth by a single melting can be performed, grains can be grown in a lateral direction (Y direction) along an irradiation direction of a laser. That is, widths of the laterally crystallized first region I and the second region 11 are a half of the irradiated laser width W, and one grain boundary in a longitudinal direction (Y direction) of the grains exists at the interface of the regions 1 and 11.

Figure 3B:
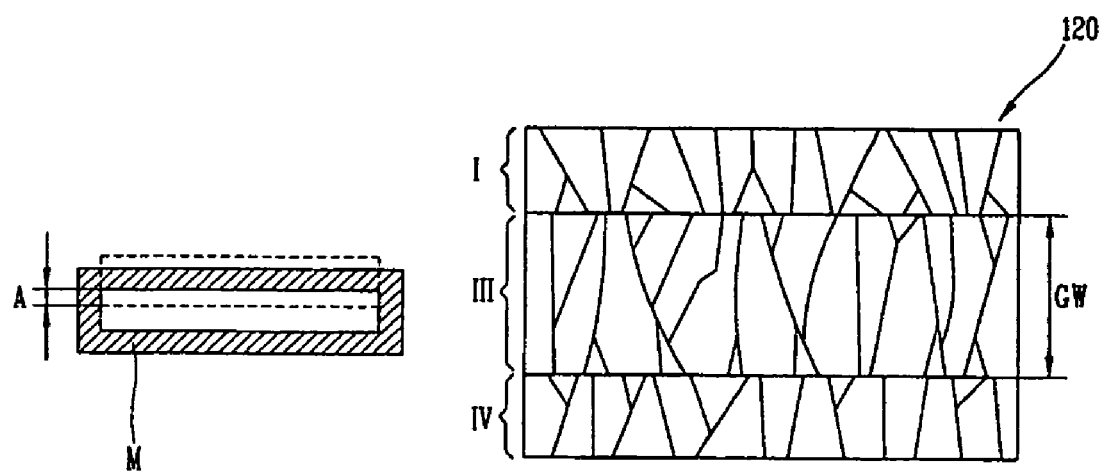

Then, in FIG. 3B, after the first laser irradiation, the substrate or a laser irradiation device are laterally moved in the Y axis direction by a certain distance to irradiate with a second laser. Said movement distance of the substrate or a laser irradiation device for the second laser irradiation after the first irradiation is called a transition distance. If the substrate is moved in the Y axis direction by a transition distance, the first laser irradiation region (the dotted region) and the second laser irradiation region are overlapped by a width "A". The width A can be arbitrarily controlled. Then, if a second laser is irradiated, a part of the second region 11 already crystallized by the first laser irradiation and the amorphous silicon 112 region under the slit S are melted, so that a sequential lateral solidification is performed. That is, a crystalline silicon 120, which was not melted, of the second region 11 and the amorphous silicon 112, which was not melted at the interface serve as a crystal nucleus, so that a lateral crystallization occurs.

As a result, the region where a crystallization is performed using the second region 11 as a nucleus has a grain size of more than 1 μm (micrometer). That is, said region has a grain size GW of a third region III that is obtained by adding a grain size of a region not irradiated by a laser of the second region 11 to a newly grown grain size 1 μm (micrometer). Also, grains, which have grown using the amorphous silicon 112 where a laser is not irradiated as a nucleus form a fourth region IV, have a grain size of 1 μm (micrometer) corresponding to an average lateral crystallization size.

Figure 3C:
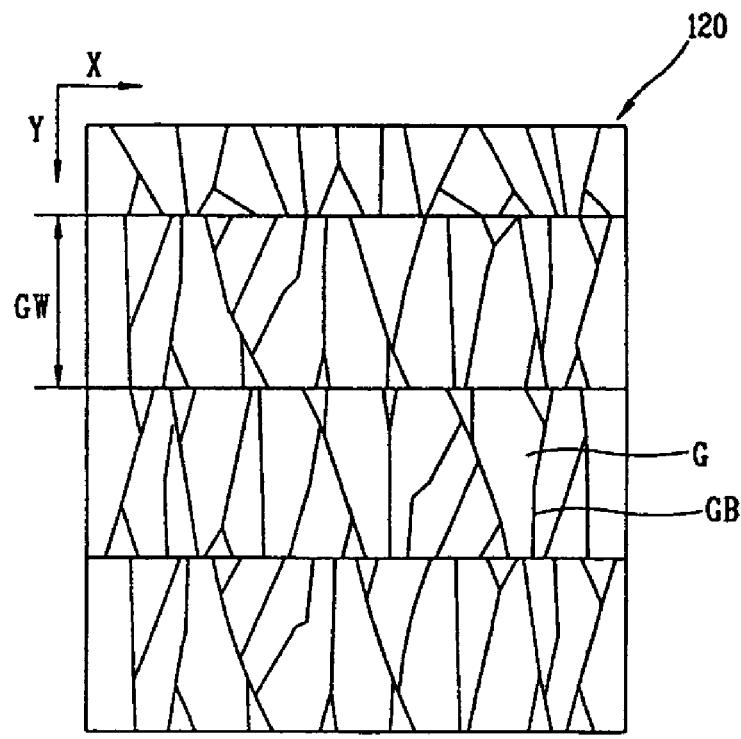

FIG. 3C shows a part of the polycrystalline silicon thin film 120 obtained by repeatedly performing the above-described processes. By repeating said processes in the Y axis direction, the amorphous silicon thin film 112 is all crystallized. Then, the substrate 110 or a laser irradiation device are laterally moved in the X axis direction as the slit length S on the mask and said processes are repeated to perform a laser annealing on a desired region entirely. As shown in FIG. 3C, the resulting amorphous silicon thin film 112 is crystallized and has a laterally grown grains G of a relatively uniform size.

Said crystallized polycrystalline silicon thin film 120 has an excellent crystallization characteristic, such as a large grain size GW corresponding to 1.5~2 μm. However, a plurality of grain boundaries GB formed in the Y axis direction blocks carrier movement in the X axis direction. To realize a device having a desired characteristic using the polycrystalline silicon thin film 120, a channel of a thin film transistor has to be arranged in the Y axis direction.

Figure 3D:
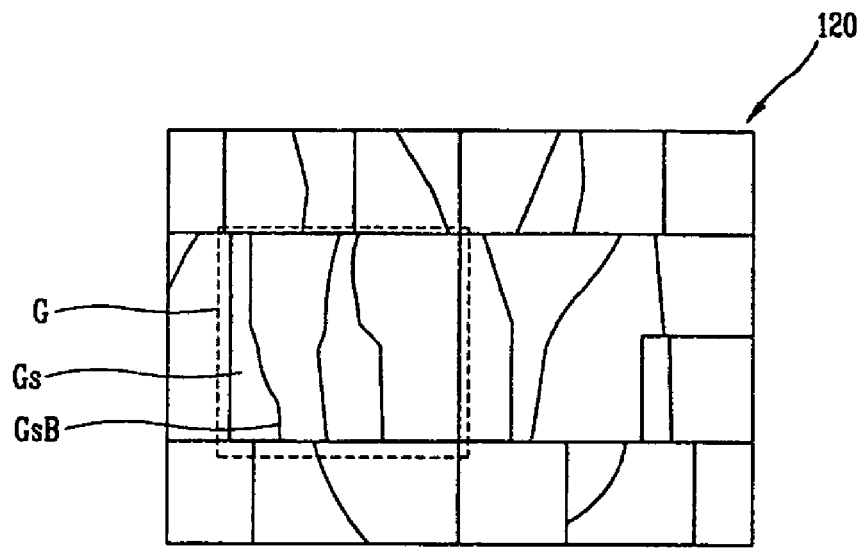

FIG. 3D shows the polycrystalline silicon thin film 120 after the second lateral crystallization. After the first lateral crystallization, a stage on which the sample is put or a laser irradiation device is rotated by 90° and then a second lateral crystallization is performed. At this time, as shown in FIG. 3D, the crystallized polycrystalline silicon thin film 120 is a quasi-single crystal and has grains G of a quasi-rectangular shape. However, a few sub grains Gs exist within the grains G that disrupt carrier movement. If a thickness of the amorphous silicon thin film 112 used in crystallization is thin, a melting duration is short at the time of a crystallization process. Accordingly, it is difficult to overcome defects due to a thermal stress and a sub grain boundary GsB. Thus, it is difficult to obtain a perfect single crystal of a square shape having no sub-grain boundaries or absolutely no directional characteristics.

Figure 4:
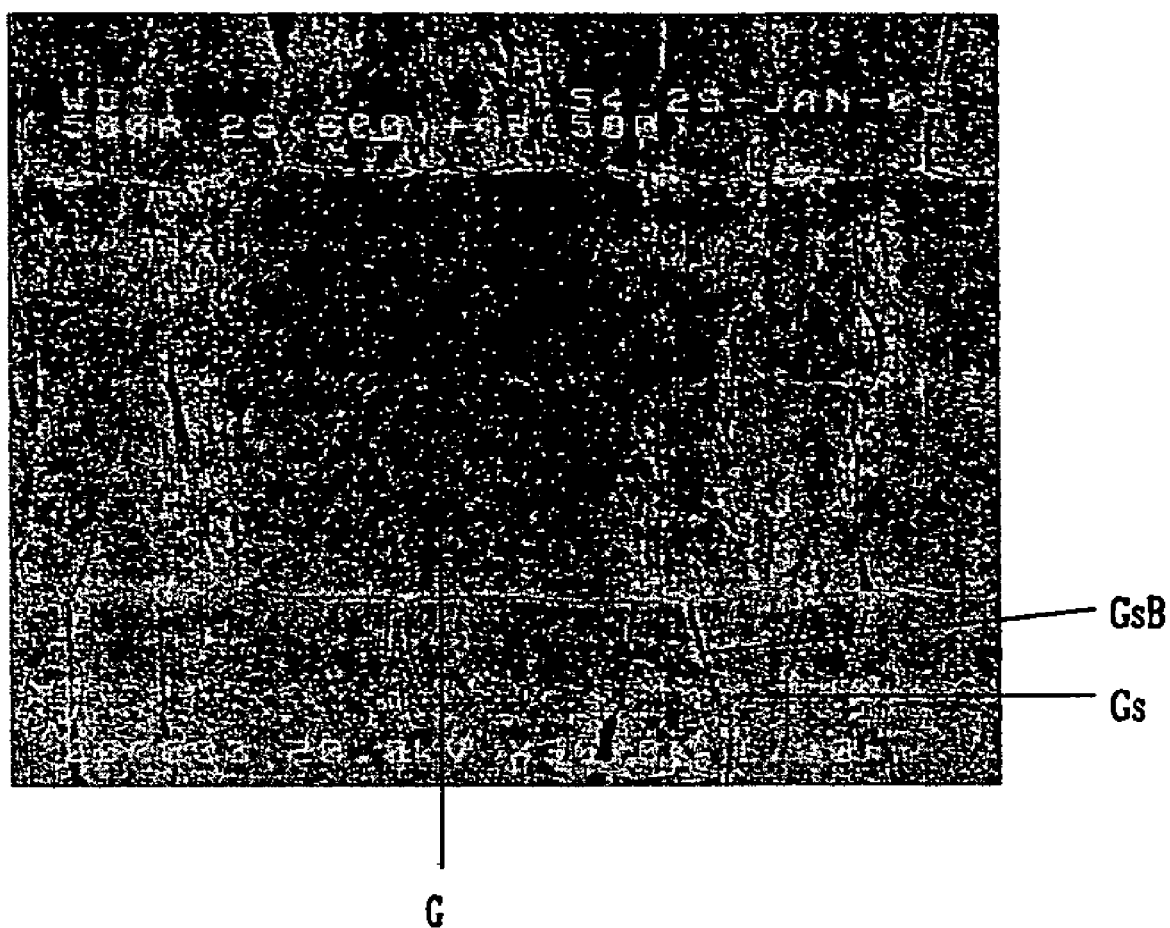
FIG. 4 is a picture from a scanning electron microscope (SEM) showing a crystallization form of the polycrystalline silicon thin film shown in FIG. 3D.

FIG. 4 is a picture from a scanning electron microscope showing a crystallization form of the polycrystalline silicon thin film shown in FIG. 3D. In FIG. 4, grains G of a rectangular shape having a size of approximately 1.5~2 μm are formed, and a few sub grains Gs are also formed within the grains G. The boundaries of the sub grains Gs (GsB) acts as an obstacle which disturbs a carrier movement, so that a crystallization method for restraining the sub grain formation is preferable, which will be explained in a next preferred embodiment.

FIGS. 5A to 5D are flow charts showing a fabrication method of a polycrystalline silicon thin film according to a second embodiment of the present invention. In said preferred-embodiment, a crystallization process is performed by using an amorphous silicon thin film having a thickness of 1000~2000 Å, which is thicker than a general thickness as an active layer of a thin film transistor. If a thickness of the amorphous silicon thin film is thick, frequency of sub grain boundaries are decreased and a polycrystalline silicon thin film having a large grain size can be obtained.

Figure 5A:
FIGS. 5A to 5D are flow charts showing a fabrication method of a polycrystalline silicon thin film according to a second embodiment of the present invention.

As shown in FIG. 5A, an amorphous silicon thin film 212 to be used in crystallization is deposited to a certain thickness on a buffer layer 211, which is on a substrate 210. Generally, any one of a variety of methods can deposit the amorphous silicon thin film 212. Such methods include low pressure chemical vapor deposition (LPCVD) and plasma enhanced vapor deposition (PECVD).

In the case that the amorphous silicon thin film is deposited by the PECVD method, hydrogen atoms of about 20% are included in the amorphous silicon thin film even though a temperature difference is somewhat generated between the substrate and the amorphous. A dehydrogenation process, which is an annealing process for discharging said hydrogen atoms from the amorphous silicon, has to be followed. Otherwise, the hydrogen atoms will form cavities in the thin film and thereby lower quality of a polycrystalline silicon thin film when the amorphous silicon thin film including hydrogen atoms is crystallized by a laser.

An optimum thickness of the amorphous silicon thin film 212 used in crystallization can be in a range of 1000~2000 Å, which does not require a very large laser energy. The greater thickness of the deposited amorphous silicon thin film 212 means that the duration time of the crystallization process is longer. A longer duration time for crystallization increases grain size of the polycrystalline silicon thin film and thus improves electrical characteristics of a device made with the polycrystalline silicon thin film.

Figure 5B:
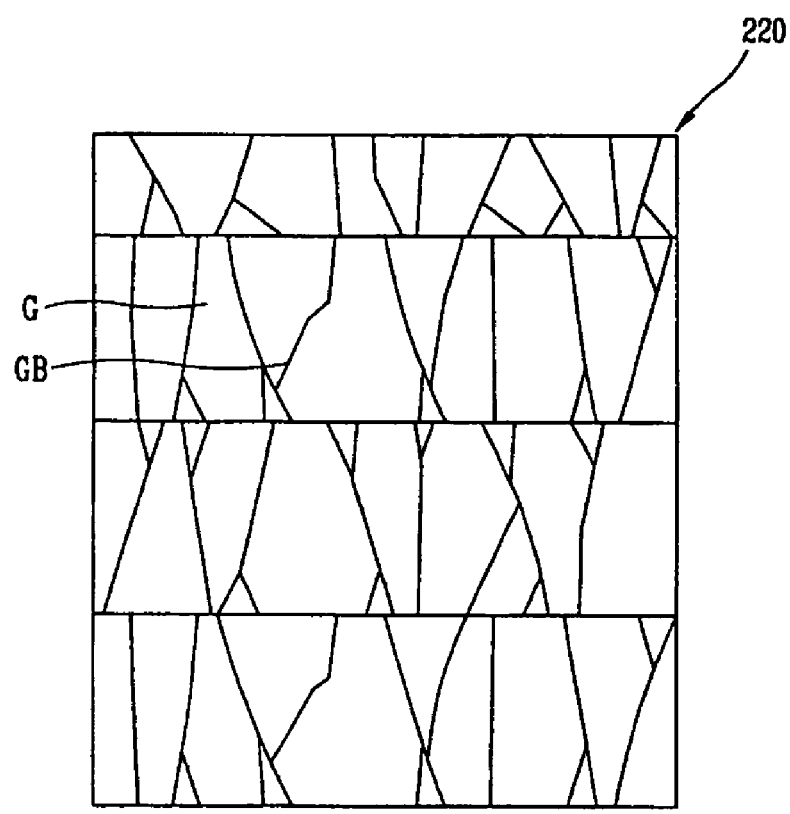

Next, as shown in FIG. 5B, if crystallization is performed by a sequential lateral solidification method, the amorphous silicon thin film 212 is crystallized to obtain the laterally grown grains G having a uniform size. Said crystallized polycrystalline silicon thin film 220 has an excellent crystallization characteristic, such as a large grain size of about 1.5~2 μm. Also, when compared with the polycrystalline silicon thin film of the first preferred embodiment of FIG. 3B, the polycrystalline silicon thin film 220 has a decreased frequency of grain boundaries G. Therefore, the thicker amorphous silicon thin film 212 used in crystallization yields a the polycrystalline silicon thin film 220 having excellent electrical characteristics.

Figure 5C:
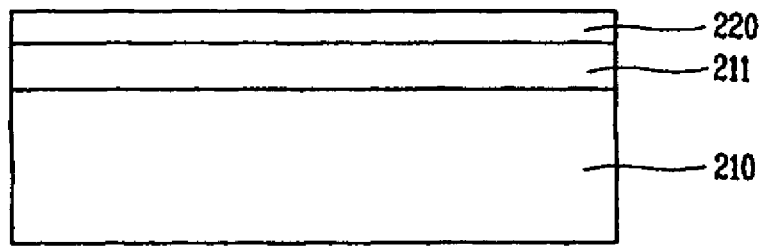

FIG. 5C shows a step of reducing the crystallized silicon thin film to leave a remaining thickness. As shown in FIG. 5C, after the first sequential lateral solidification, the crystallized silicon thin film 220 used as an active layer is reduced to a certain thickness 300~600 Å remaining in order to obtain excellent electrical characteristics, such as decreased leakage current. At this time, for instance, an etching technique can be used to reduce the thickness of the crystallized silicon thin film.

In this second embodiment, an etch back method for reducing the silicon thin film 220 to the substrate 210 without a mask was used. Herein, the polycrystalline silicon thin film 220 formed by the first crystallization maintains the grain formation while only a thickness thereof is decreased. Said crystallized polycrystalline silicon thin film 220 includes a protrusion portion at the grain boundary surface, and the protrusion portion is removed by etching the entire upper surface of the polycrystalline silicon using the etch back technique. As a result, the physical morphology of the polycrystalline silicon thin film 220 can be improved. Herein, the protrusion portion corresponds to a defect having a greater etching rate than grains, so that it is first etched faster than the grain at the time of etching a silicon. Finally, after the first lateral crystallization, a stage on which a sample is put or a laser irradiation device are rotated with 90° and then a second lateral crystallization is performed.

Figure 5D:
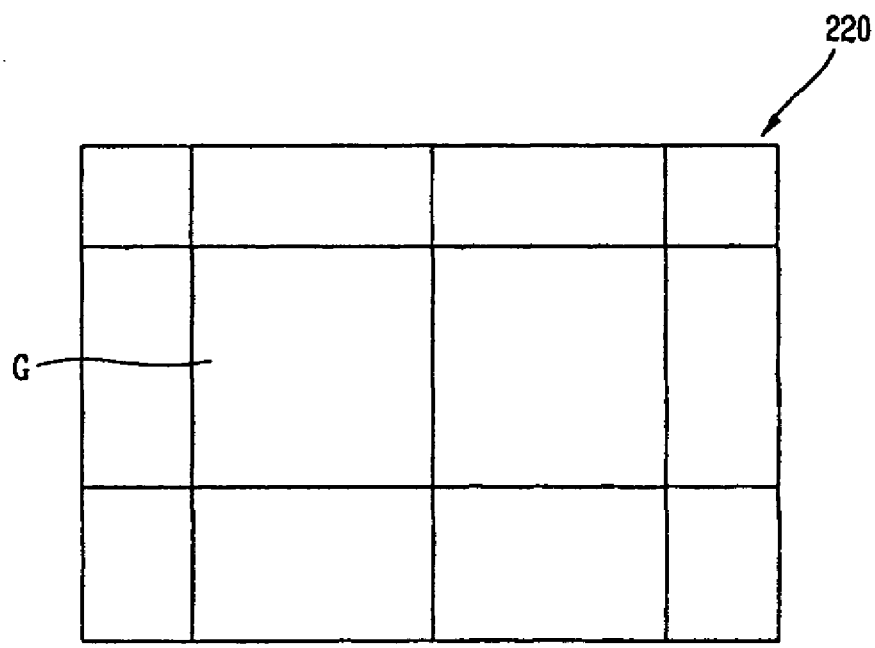

In FIG. 5D, when the crystallized polycrystalline silicon thin film 220 is crystallized by using a second lateral solidification method, re-crystallization proceeds in a state that the sub grain boundary is restrained to obtain single crystal grains G of a rectangular shape. At this time, a surface of the crystallized polycrystalline silicon thin film 220 damaged by etching is cured through the sequential lateral solidification.

Thus, according to the second embodiment, the first crystallization is performed by making a thickness of an amorphous silicon thin film to be used in crystallization thicker than a generally used active layer, a polycrystalline silicon thin film having a large grain size and a decreased grain boundary density can be obtained. Subsequently, the crystallized silicon thin film is etched so as to have an active layer thickness for obtaining a desired electric characteristic and then re-crystallized, thereby obtaining a polycrystalline silicon thin film having a rectangular shape.

Figure 6:
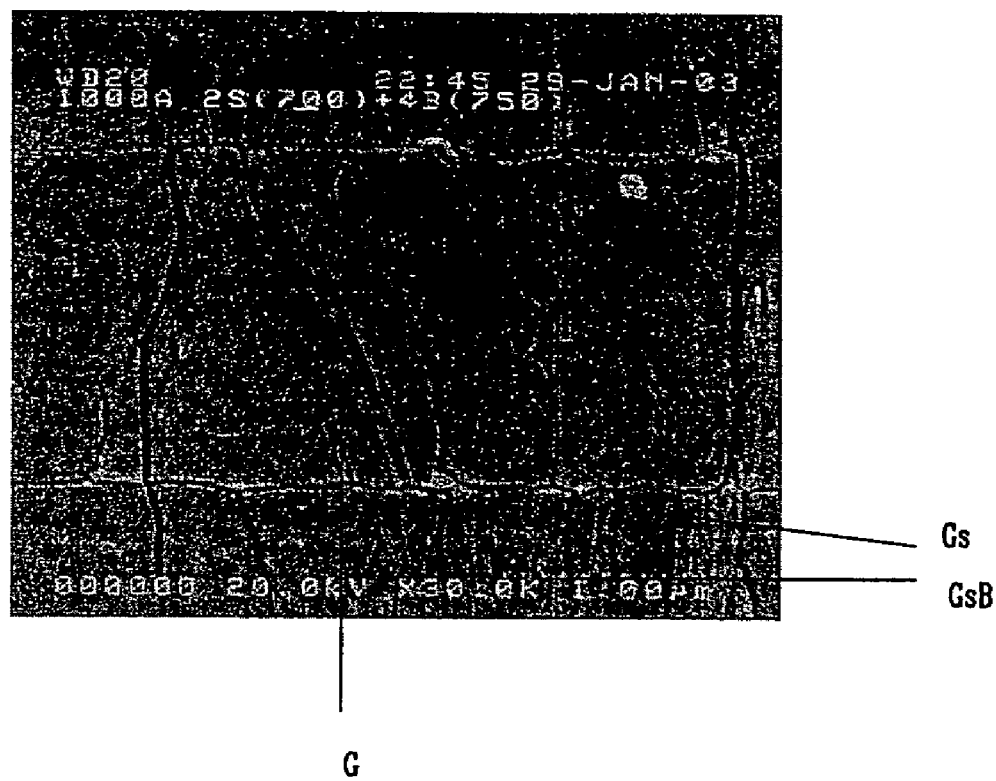
FIG. 6 is a picture from a scanning electron microscope showing a crystallization form of the polycrystalline silicon thin film shown in FIG. 5D.

FIG. 6 is a picture from a scanning electron microscope showing a crystallization form of the polycrystalline silicon thin film shown in FIG. 5D. In FIG. 6, single crystal grains G of a substantially perfect square shape is formed, and differently from the first embodiment of FIG. 4, few sub grains Gs are formed in the grains G. Like in the first and second embodiments, if the polycrystalline silicon thin films 120 and 220 of a quasi-single crystal are formed by a first lateral-crystallization in a first direction and then a second lateral crystallization is performed in a second direction perpendicular to the first direction, polycrystalline silicon thin films 120 and 220 can be obtained having a rectangular shape that has no direction-dependent characteristic. Especially, since the grain direction-dependent characteristic of the polycrystalline silicon thin films 120 and 220 formed by the first and second embodiments was removed, an arrangement direction of a thin film transistor need not to be considered at the time of fabricating the thin film transistor, thereby providing for a high integration of thin film transistor devices.

Figure 7:
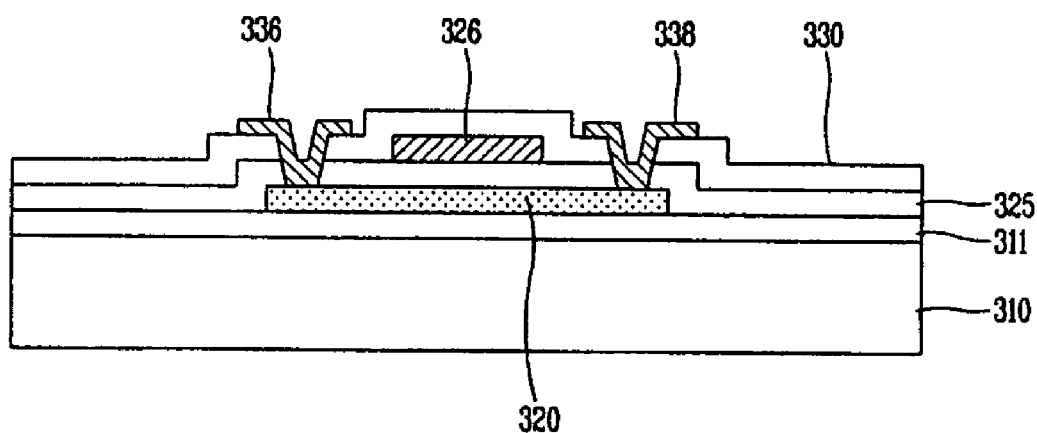
FIG. 7 shows a structure of a polycrystalline thin film transistor according an embodiment of the present invention.

A thin film transistor can be fabricated by using the polycrystalline silicon thin film formed according to said embodiments as an active layer. FIG. 7 shows a structure of a thin film transistor using a polycrystalline silicon thin film formed according to an embodiment of the present invention. Herein, a structure shown in the drawing is a polycrystalline silicon thin film transistor of a top-gate structure. Referring to FIG. 7, a fabrication method of a polycrystalline silicon thin film transistor will be explained as follows.

First, an amorphous silicon is deposited on a buffer layer 311 formed on a substrate 310, and crystallized by said crystallization method. Then, the polycrystalline silicon is patterned by a photolithography process, thereby forming an active pattern polycrystalline silicon layer 320. The active layer 320 has a grain with at least a quasi-rectangular shape if not a rectangular shape. Then, a gate insulating film 325 is formed on the active pattern 320, and then a conductive film is deposited and etched to thereby form a gate electrode 326 on the gate insulating film 325. Next, an insulating layer 330 is deposited on the gate electrode 326, and then the gate insulating layer 325 and the insulating layer 330 are etched to expose the active pattern. Then, a source electrode 336 and a drain electrode 338 contacting the active layer 320 within the quasi-rectangular shape of a grain are formed on the insulating layer 330 to thereby complete the thin film transistor.

A thin film transistor manufactured by the above-described process not only includes the top-gate thin film transistor but can also include a bottom-gate thin film transistor. Typically, in the amorphous silicon thin film transistor, the bottom-gate transistor is used. However, in a thin film transistor where a polycrystalline silicon is used as an active layer, the electrical characteristics of the bottom-gate thin film transistor are inferior to that of the top-gate thin film transistor and therefore less preferable.

The polycrystalline silicon thin film transistor is mainly positioned at a driving circuit region rather than in a pixel of an liquid crystal display device. This is because a thin film transistor of the driving circuit region requires greater field effect mobility. Instead of a polycrystalline silicon thin film transistor, an amorphous silicon thin film transistor can be arranged in the pixel.

In the case that polycrystalline silicon thin film transistors are arranged in the driving circuit region, the polycrystalline silicon thin film transistor can be used in a complementary metal oxide semiconductor (CMOS). Although not shown, an n type impurities and a p type impurities are injected into active layers 320, thereby respectively forming an n type thin film transistor and a p type thin film transistor.

Substantially, an amorphous silicon thin film transistor in the pixel and a polycrystalline silicon thin film transistor in the driving circuit region have the similar forming processes except a process for crystallizing an amorphous silicon layer. Accordingly, a polycrystalline silicon thin film transistor in the driving circuit region and an amorphous silicon thin film transistor in the pixel can be formed at the same time in the same fabrication line except for the process for crystallizing the amorphous silicon layer.

A fabrication method of a liquid crystal display device provided with said thin film transistor will be explained as follows. First, thin film transistors, that is, an amorphous silicon thin film transistor in the pixel (or a polycrystalline silicon thin film transistor) and a polycrystalline silicon thin film transistor in the driving circuit region, are formed. Then, a passivation film having a contact hole is formed and a pixel electrode connected to the drain electrode of the thin film transistor is formed on the passivation film. At the time of forming the thin film transistor, a gate line and a data line for applying a signal are formed in the pixel.

A substrate where the thin film transistor and the pixel electrode are formed is attached to an opposite substrate where a color filter layer and a common electrode are formed, and a liquid crystal layer is formed therebetween, thereby fabricating an liquid crystal display device.

In the present invention, a polycrystalline semiconductor layer having grains of a quasi-rectangular or rectangular shape is formed by a lateral solidification method and an etching process, and a thin film transistor is formed by using the polycrystalline semiconductor layer. In forming the thin film transistor, 7 masks were used. However, the thin film transistor can be fabricated not only by using 7 masks but also by processes using any number of masks. In other words, the present invention can be applied to a variety of thin film transistors having different structures.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What claimed is:

1. A method of fabricating a liquid crystal display device comprising:
    forming a first thin film transistor in a driving circuit region by using a crystallized semiconductor layer as an active layer by providing a first substrate composed of a pixel region and a driving circuit region, forming an amorphous semiconductor layer having a first thickness on the first substrate, laterally crystallizing the amorphous semiconductor layer in a first direction, partially etching the crystallized semiconductor layer to a second thickness, and laterally crystallizing the partially etched crystallized semiconductor layer in a second direction perpendicular to the first direction;
    forming a second thin film transistor in the pixel region;
    forming a pixel electrode electrically connected to the second thin film transistor on the first substrate;
    providing a second substrate where a color filter layer is formed;
    attaching the first substrate and the second substrate to each other; and
    forming a liquid crystal layer between the first substrate and the second substrate.

2. The method according to claim 1, wherein the lateral crystallization of the amorphous semiconductor layer is a sequential lateral solidification.

3. The method according to claim 1, wherein forming the first thin film transistor includes:
 forming a gate insulating layer on the crystallized semiconductor layer;
 forming a gate electrode on the gate insulating layer;
 forming an insulating layer on the gate electrode; and
 forming a source electrode and a drain electrode contacting the crystallized semiconductor layer on the insulating layer.

4. The method according to claim 3, further comprising injecting an n type impurity into the crystallized semiconductor layer.

5. The method according to claim 3, further comprising injecting a p type impurity into the crystallized semiconductor layer.

6. The method according to claim 3, wherein the first thin film transistor and the second thin film transistor are formed in the same fabrication line.

7. The method according to claim 3, wherein the first thin film transistor and the second thin film transistor are integrally formed.

8. The method of claim 1, wherein forming the second thin film transistor includes:
 forming an amorphous semiconductor layer on a first substrate;
 forming a gate electrode on the amorphous semiconductor layer;
 forming an insulating layer on the gate electrode; and
 forming a source electrode and a drain electrode contacting the crystallized semiconductor layer on the insulating layer.

9. The method according to claim 8, wherein the first thin film transistor and the second thin film transistor are formed in the same fabrication line.

10. The method according to claim 8, wherein the first thin film transistor and the second thin film transistor are integrally formed.

11. The method according to claim 1, wherein the first thickness is approximately 1000~2000 Å and the second thickness is approximately 300~600 Å.

* * * * *